June 9, 1964 R. C. SWENGEL Re. 25,591

SPRING CLIP TERMINAL FOR PRINTED CIRCUIT BOARD

Original Filed Feb. 11, 1957

INVENTOR.
ROBERT C. SWENGEL
BY
Lentz, Morris + Safford

United States Patent Office

Re. 25,591
Reissued June 9, 1964

25,591

SPRING CLIP TERMINAL FOR PRINTED CIRCUIT BOARD

Robert C. Swengel, Hellam, Pa., assignor to AMP Incorporated, Harrisburg, Pa.

Original No. 3,079,578, dated Feb. 26, 1963, Ser. No. 46,854, June 22, 1960, which is a division of Ser. No. 639,461, Feb. 11, 1957, now Patent No. 2,980,878, dated Apr. 18, 1961. Application for reissue Apr. 9, 1963, Ser. No. 272,825
7 Claims. (Cl. 339—17)

Matter enclosed in heavy brackets [ ] appears in the original patent but forms no part of this reissue specification; matter printed in italics indicates the additions made by reissue.

This invention relates to printed circuit connections and more particularly to an improved printed circuit board or panel and terminal clips cooperable therewith for making connections between the electrical network defined by the printed circuit board and electrical circuitry external to the printed circuit board. This application is a division of my copending application, Serial No. 639,461, filed February 11, 1957, now Patent No. 2,980,878, issued April 18, 1961.

As used herein, the term printed circuit board includes a supporting base or body of any suitable insulating material on which the electrical wiring of an electronic circuit is reproduced by any suitable process such as chemical deposition, die stamping, painting, etc. The circuit design may encompass both sides of the panel and may be printed with or without other circuit parameters such as resistors, capacitors, etc., the wiring usually taking the form of extremely thin and narrow strips or ribbons of electrically conductive material such as copper, silver, or tin, or a combination thereof.

It is therefore an object of the present invention to provide electrical connections with printed circuit boards which are simple in construction and in installation and inexpensive to produce;

Another object is to provide a printed circuit connection for external wiring which may readily be disconnected for disassociating the printing circuit unit from the remainder of the system;

Another object of the present invention is to provide a printed circuit panel connection wherein an external lead wire is directly coupled to the printed circuit conductive ribbons through a single solderless terminal part;

Still another object is to provide in a friction fit connection for printed circuit panels, connector parts which are self-cleansing, require low connective forces, but result in high contact pressures over the contact areas without damage to the conductive ribbons of the printed circuit panel;

Still another object is to provide in a frictional fit connection for printed circuit panels, a terminal clip sufficiently resilient to accept wide variations in thickness of the insulation body and to overcome plastic creep of the insulation under load;

A still further object is to provide in a frictional fit connection for printed circuit panels a terminal clip which promotes the circulation of air for ventilation purposes and avoids entrapment of moisture or other foreign matter within the connector parts;

A still further object is to provide in a friction fit connection for printed circuit panels a terminal clip which is mechanically stable under vibration or externally imposed stresses on the lead-in wires.

In general these and other objectives are attained in accordance with the present invention by providing in a printed circuit panel a plurality of slots which extend inwardly from one or more of the side edges of the panel, the number of slots corresponding to the number of external connections desired. Incorporated within the circuit design printed on the panel are a number of conductive ribbons leading from the input and output junctions of the circuitry involved, which ribbons extend to the panel side edges along and adjacent appropriate slots. These slots are adapted to receive a sheet metal terminal which includes a coupling portion adapted for solderless connection to electrical circuitry, such as a lead-in wire external of the panel, and a clip portion which comprises a base and resilient spring elements extending from the base, for example, a pair of lateral arms extending from opposite sides of and turned back upon the base. In connection the clip base is received within an appropriate panel slot with the end edges of the spring arms gripping the panel resiliently therebetween with at least one of the end edges bearing upon an adjacent lead ribbon.

Other objects and attainments of the present invention will become apparent to those skilled in the art upon a reading of the following detailed description when taken in conjunction with the drawings in which there are shown and described illustrative embodiments of the invention; it is to be understood however that these embodiments are not intended to be exhaustive nor limiting on the scope of the invention but are given for purposes of illustration in order that others skilled in the art may fully understand the invention and the principles thereof and the manner of applying it in practical use so that they may modify it in various forms each as may be best suited to the conditions of a particular use.

Figure 1:
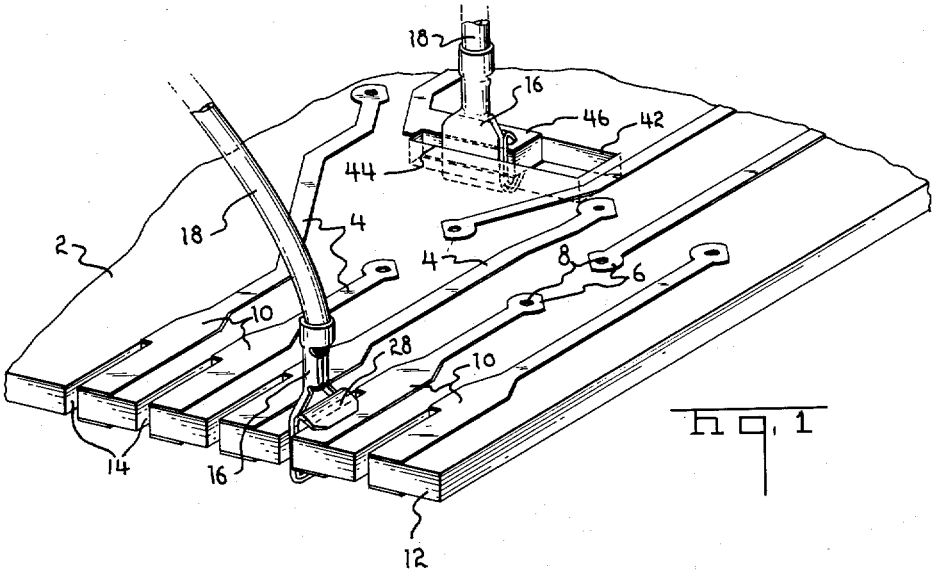
FIGURE 1 is a fragmentary view in perspective of a printed circuit board having connections made in accordance with the present invention.

Referring now to FIGURE 1, a printed circuit board panel or body 2 of suitable insulation material has reproduced thereon a circuit pattern or design including a plurality of thin narrow strips or ribbons 4 of conductive material which represent the intercomponent wiring of an electronic assembly. The ends 6 of some of strips 4 terminate at apertures 8 into which the leads of components, not shown, such as resistors, coils, tubes, etc., are inserted and then soldered, all as is conventional in the art. The printed circuit design may be composed of strips 4 on either, or as is the usual case, on both sides of panel 2, the connection of my invention being applicable in either case.

The segments or strip ends 10 which constitute the input and output leads of the circuit defined by strips 4 are brought, in accordance with the present invention, to any side edge 12 of panel 2, and, for reasons to become apparent, preferably are widened to several times the approximate 0.025 inch strip width usually sufficient for strips 4. Extending inwardly of side edge 12 adjacent and along strip ends 10 respectively are a plurality of slots 14, each being adapted to receive in electrical connection with the associated strip end 10 a terminal 16 attached to the end of an external lead 18. By bringing strip ends 10 to various edges of the board, it will be apparent that like connections may be made on any side of panel 2 although, as is shown in FIGURE 1, all connections are conveniently made in practice along one side edge 12. The connection afforded by terminal 16 thus serves to couple external lead wire 18 to the desired input or output strip end 10, any desired number of such connections being provided, corresponding, for example, to the number of input or output leads required to complete incorporation of the circuit of the printed circuit board within the electrical equipment involved.

Figure 2:
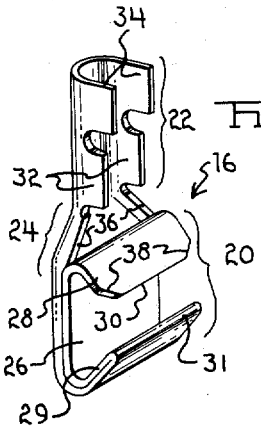
FIGURE 2 is an enlarged view in perspective of the form of terminal prior to attachment of a lead wire for making connections laterally of the printed circuit board as shown in FIGURE 1.

Terminal 16, of suitably resilient sheet metal such as No. 4 hard brass, includes a clip portion 20, FIGURE 2 for contacting strip ends 10, and a coupling portion 22 integrally connected to clip 20 by transition section 24, coupling portion 22 being adapted to affix the terminal electrically and mechanically to lead wire 18 as generally indicated in FIGURE 1. Clip 20 comprises a generally rectangular base 26 adapted to be slipped within a slot 14 at right angles to panel 2, and opposed spring arms 28 and 29 extending from opposite sides of and turned back upon base 26 to terminate in longitudinally directed linear end edges 30 and 31 spaced to engage resiliently the upper and lower faces of panel 2. More particularly, arms 28 and 29 are turned back upon base 26 about radii of curvature as large as possible to avoid concentration of stresses during flexure, and extend linearly thereafter outwardly from base 26 to form therewith an open-ended channel for receiving an edge portion of panel 2 as defined by one side of a slot 14. Edges 30 and 31, however, are spaced less than any anticipated thickness of panel 2 so that on assembling the connection these edges forcibly bear on the opposed surfaces of the board and on the conductive strips with which the slot is associated.

In general coupling portion 22 may take a variety of forms but is solderless in nature, that is, a ferrule-forming part adapted to be cold crimped onto the end of lead wire 18 by solderless techniques well known in the art. Such a ferrule typically includes a U-shaped portion having first upstanding ears 32 adapted for turning inwardly and downwardly upon the exposed metallic core of lead 18 and a second pair of ears 34 which are formed about the insulation, if any, of the lead in the crimping process. Alternatively, coupling portion 22 may be omitted where the function to be served is to couple opposed strips on the upper and lower surfaces of the board. Transition section 24 serves to reduce the wider clip portion to the width of coupling portion 22 and is flanged at edges 36 to lend rigidity to the construction.

It will be apparent that terminal 16 may be formed from sheet metal by conventional blanking and shaping techniques well known in the art, conveniently in strip form, that is a string of terminals wherein each terminal is joined to others in ladder form, not shown. When thus formed the terminals may be wound in reels for application to leads 18 by automatic or semi-automatic crimping machines.

With coupling portion 22 crimped onto the end of lead wire 18, insertion of clip base 20 within a slot 14 and introduction of an edge portion of the board within the channel defined by the clip cause resilient spring arms 28 and 29 to be wedged open and end edges 30 and 31 to be brought into forceful engagement with strip ends 10 thereby providing the desired solderless connection between lead wire 18 and printed circuit strips 4. To facilitate application of base 20 to the appropriate slot 14 the forward corner 38 of arm 28 is chamfered or beveled so as to curve away from the insertion end of the clip thus to produce initially a smooth camming action for distending the spring arms. In addition the width of slot 14 will, of course, be wider than the thickness of base 20 to provide a target area of suitable scope for facile indexing of the clip base.

Figure 3:
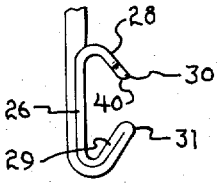
FIGURE 3 is an enlarged fragmentary side view of the terminal of FIGURE 2.

Electric continuity between clip 20 and a strip 4 will be seen to be a line contact afforded by end edges 30 and 31 bearing on strip ends 10. To avoid damaging the relatively delicate printed circuits strips, typically of the order of .001 inch in thickness, inside corner 40 of end edge 30 is rounded as best shown in the enlarged cross sectional view of FIGURE 3.

In making the connection, as the clip is slipped into position, the relatively harder metal of the clip is caused at end edges 30 and 31 forcefully to bear on a very limited area of the softer metal of the printed circuit strips, commonly a base of copper overlaid with tin. Because of the small area of contact even relatively small distensions of the clip spring arms result in relatively high contact pressures that deform and slightly groove the metal of the strips as end edges 30 and 31 progress therealong. Rounded corner 40, however, effectively increases the bearing surface sufficiently to prevent shearing of the conductive strips. Advantageously, the burnishing and grooving action removes any foreign material while exposing fresh metal at the contact surfaces.

As shown in the drawings, terminal [15] *16* is of a flag-type construction wherein the base 26 and one of the spring arms 29 of the clip portion are formed in a double layer of sheet metal, the two layers being integrally joined along the end edge 31 of arm 29. Transition section *or shank portion* 24 is a lateral continuation of the bottom layer of the double layer base 26 with the longitudinal axis of the ferrule-forming or coupling portion [52] *22* laterally extending centrally of the clip portion. Advantageously, on insertion of the clip fully within a slot 14, no portion of the terminal extends beyond the board edge in the plane of the board. In addition this embodiment is suitable for making connections centrally of the board, requiring only that the board be apertured, as at 42 in FIGURE 1, to permit passage of the clip portion endwise into the board. Aperture 42 includes a slot extension 44 for reception of base 26, strip end 46 being disposed adjacent the slot for contact by the clip arms to effect a connection similar to that as has been described.

The embodiment illustrated by the foregoing description achieves the stated objectives, primarily being the provision of a solderless frictional-fit connection for printed circuit applications which is versatile, of high electrical and mechanical quality, simple in assembly and inexpensive in construction. It will be apparent that the basic principles disclosed admit of many modifications within the scope of the invention which will occur to those skilled in the art. By way of specific example dimensionally, however, good results can be obtained in a connection formed in accordance with the embodiment wherein panel 2 is $0.062 \pm 0.005$ in thickness, slots 14 being spaced along the panel edge of 0.156 centers and each having a width of 0.020 and a length of 0.210, and strips 4 (tin-clad copper) being 0.001 in thickness with strip ends 10 being 0.100 in width, all dimensions being in inches. Terminal 16 may be formed of No. 4 hard tin-plated brass 0.010 in thickness, clip portion 20 being 0.200 in length and 0.153 in width and having spring arms turned about a 0.020 radius to extend at approximately a 30° angle to base 26 and to a height of 0.080 thereabove. The relative spacing of edges 30 and 31 approximates 0.050, the inside corners being broken about a radius of approximately 0.003. It will be observed that strip ends 10 are sufficiently wide, relative to the overhand, of spring arms 28 and 29 over the panel face, to accommodate substantial variation in the location of the contact line.

I claim:

1. An integral sheet metal terminal comprising a coupling portion for connecting the terminal to a conductor wire, and a spring clip portion including a base and a pair of lateral arms extending from opposite sides of and turned back upon said base, the end edges of said arms being spaced from each other, at least one of said end edges being smoothly rounded, said coupling portion extending laterally from one of said opposite sides and integrally joined to said clip portion at the end edge of the arm extending from the other of said opposite sides.

2. An electrical connection comprising a printed circuit panel having a slot adjacent a conductive ribbon, an integral sheet metal terminal comprising a coupling portion for connecting the terminal to electrical circuitry external of the circuit panel, and a spring clip portion including a base and a pair of lateral arms extending from opposite sides of and turned back upon said base, the thickness of the sheet metal forming said clip being less than the width of the slot, the end edges of said arms having a relaxed relative spacing less than the thickness of the panel so that with the clip base arranged in the slot said arms are [distened] *distended* and grip the panel with spring pressure, one of said edges bearing upon the adjacent conductive ribbon, said coupling portion extending laterally from one of said opposite sides and integrally joined to said clip portion at the end edge of the arm extending from the other of said opposite sides.

3. An electrical terminal for frictionally engaging a flat plate-like contact member comprising a one-piece sheet metal stamping of a coupling portion including a trough having ears upstanding from the sides thereof for crimping onto a conductor wire, a spring clip portion including a base and a pair of lateral spring arms extending from opposite sides of and turned back over said base for slidably engaging a contact member inserted in and along the axis of the clip portion in a direction coaxial with said sides, and a shank portion connecting said coupling and clip portions, said shank portion extending from said clip portion laterally of said axis.

4. A sheet metal terminal as set forth in claim 3 wherein said shank portion laterally projects from one of said opposite sides and integrally joins with the spring arm on the other of said opposite sides.

5. A sheet metal terminal as set forth in claim 3 wherein the longitudinal axis of said trough is perpendicular to the axis of the clip portion.

*6. An electrical terminal for frictionally engaging a flat plate-like contact member comprising a one-piece sheet metal stamping including a trough having ears upstanding from the sides thereof for crimping onto a conductor wire, and a spring clip including a base and a pair of lateral spring arms extending from opposite sides of and turned back over one surface of said base for slidably engaging a contact member inserted in and along the axis of the clip in a direction coaxial with said sides,*

*and means having opposite ends respectively joined with said trough and clip with said trough being disposed substantially centrally relative to said clip, sid means adjacent one end extending laterally of said axis and at the other end being disposed adjacent the other surface of the base to open said clip at either end for reception of said contact member.*

*7. An electrical terminal for frictionally engaging a flat plate-like contact member comprising a one-piece sheet metal stamping including a trough having ears upstanding from the sides thereof for crimping onto a conductor wire, a spring clip including a base and a pair of lateral spring arms extending from opposite sides of and turned back over one surface of said base to define a channel for slidably engaging a contact member inserted in and along the axis of the clip in a direction coaxial with said channel, and means having opposite ends respectively joined with said trough and clip with said trough being disposed substantially centrally relative to said clip to confine the length of the terminal to substantially the length of said channel, said means adjacent one end extending laterally of said axis and at the other end being disposed adjacent the other surface of the base to open said clip at either end for reception of said contact member and to dispose said conductor wire when crimped onto said trough transverse of said axis.*

References Cited in the file of this patent or the original patent

UNITED STATES PATENTS

| | | |
|---|---|---|
| 1,827,533 | Martin | Oct. 13, 1931 |
| 1,841,736 | Jones | Jan. 19, 1932 |
| 2,526,937 | Cripe | Oct. 24, 1950 |
| 2,945,206 | Hammell | July 12, 1960 |

OTHER REFERENCES

AMP, "Electronic Design," Nov. 15, 1956, page 17.